United States Patent
Huang et al.

(10) Patent No.: US 9,425,267 B2
(45) Date of Patent: Aug. 23, 2016

(54) TRANSISTOR WITH CHARGE ENHANCED FIELD PLATE STRUCTURE AND METHOD

(71) Applicant: Freescale Semiconductor, Inc., Austin, TX (US)

(72) Inventors: Jenn Hwa Huang, Chandler, AZ (US); James A. Teplik, Mesa, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 82 days.

(21) Appl. No.: 13/826,209

(22) Filed: Mar. 14, 2013

(65) Prior Publication Data

US 2014/0264360 A1     Sep. 18, 2014

(51) Int. Cl.
*H01L 29/40* (2006.01)
*H01L 29/423* (2006.01)
*H01L 29/66* (2006.01)
*H01L 29/778* (2006.01)
*H01L 29/20* (2006.01)

(52) U.S. Cl.
CPC ......... *H01L 29/402* (2013.01); *H01L 29/2003* (2013.01); *H01L 29/404* (2013.01); *H01L 29/4238* (2013.01); *H01L 29/66462* (2013.01); *H01L 29/7787* (2013.01)

(58) Field of Classification Search
CPC ........... H01L 29/66431; H01L 29/402; H01L 29/66462; H01L 29/42316; H01L 29/475; H01L 29/778–29/7789

USPC .......... 257/488, E29.006, E29.007, E29.009, 257/E29.017
See application file for complete search history.

(56) References Cited

U.S. PATENT DOCUMENTS

| | | | |
|---|---|---|---|
| 5,585,293 A | 12/1996 | Sharma et al. | |
| 9,178,016 B2 * | 11/2015 | Strassburg | H01L 29/0638 |
| 2006/0011915 A1 * | 1/2006 | Saito et al. | 257/65 |
| 2008/0035934 A1 * | 2/2008 | Sheppard | H01L 21/045 257/76 |
| 2009/0184365 A1 * | 7/2009 | Sekine et al. | 257/326 |
| 2011/0121313 A1 * | 5/2011 | Briere | 257/76 |
| 2011/0169103 A1 | 7/2011 | Darwish et al. | |
| 2012/0018735 A1 * | 1/2012 | Ishii | 257/76 |

* cited by examiner

*Primary Examiner* — Jessica Stultz
*Assistant Examiner* — Mohammed R Alam

(57) ABSTRACT

Transistors and methods of fabricating are described herein. These transistors include a field plate (108) and a charged dielectric layer (106) overlapping at least a portion of a gate electrode (102). The field plate (108) and charged dielectric layer (106) provide the ability to modulate the electric field or capacitance in the transistor. For example, the charged dielectric layer (106) provides the ability to control the capacitance between the gate electrode (102) and field plate (108). Modulating such capacitances or the electric field in transistors can facilitate improved performance. For example, controlling gate electrode (102) to field plate (108) capacitance can be used to improve device linearity and/or breakdown voltage. Such control over gate electrode (102) to field plate (108) capacitance or electric fields provides for high speed and/or high voltage transistor operation.

24 Claims, 10 Drawing Sheets

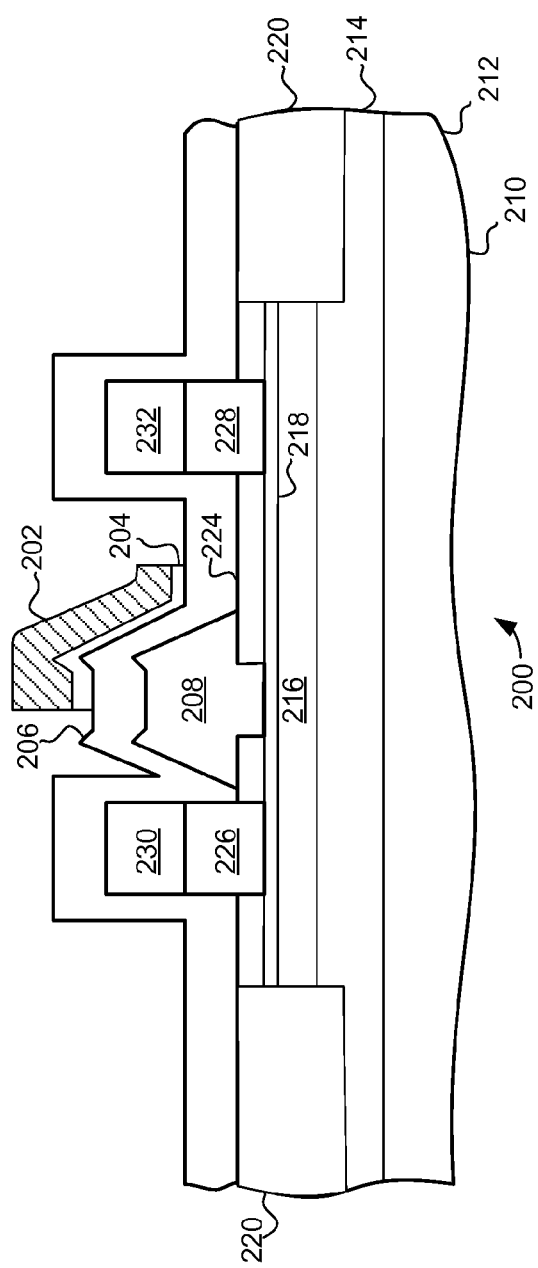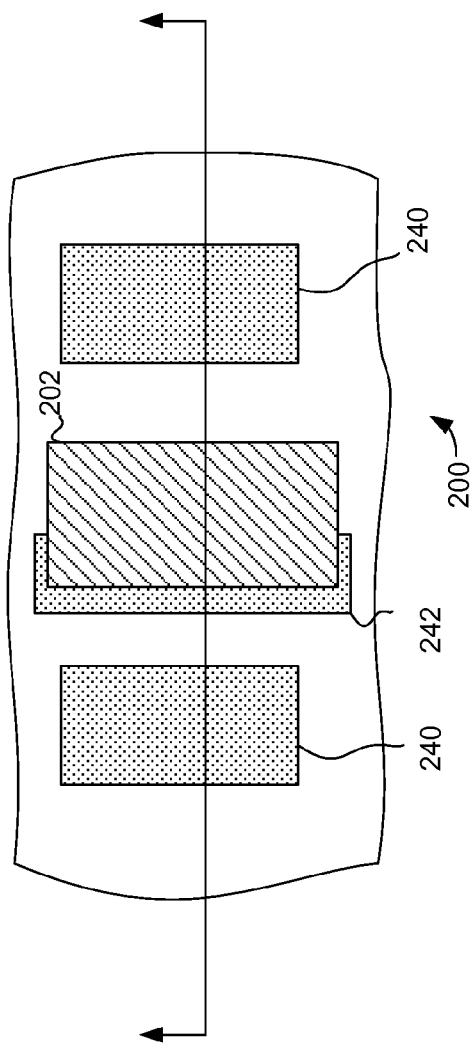

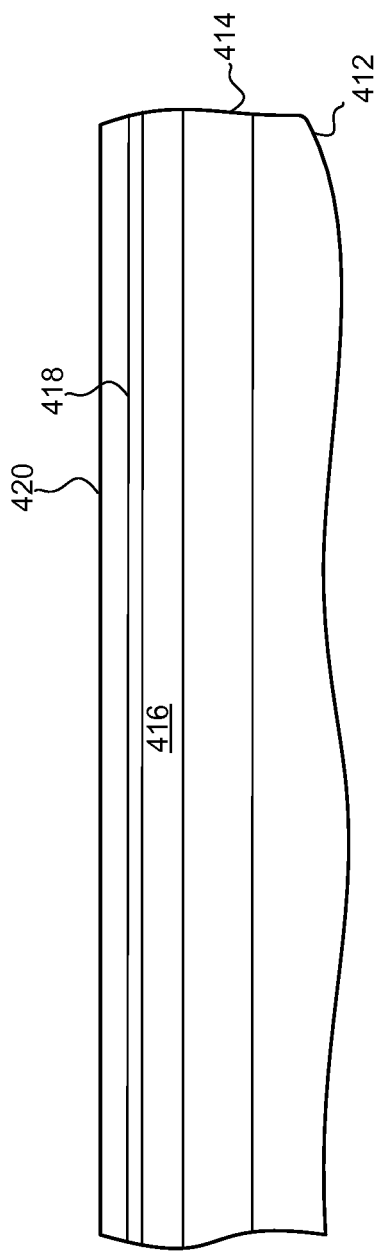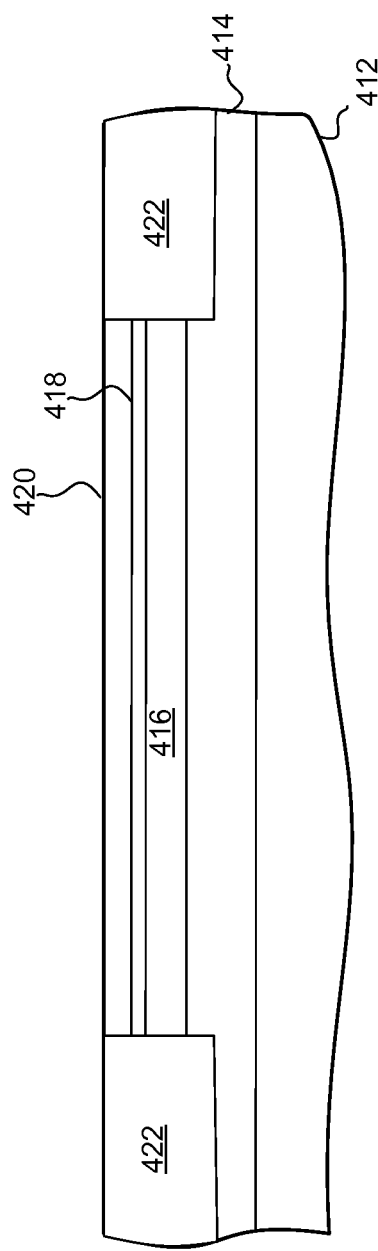

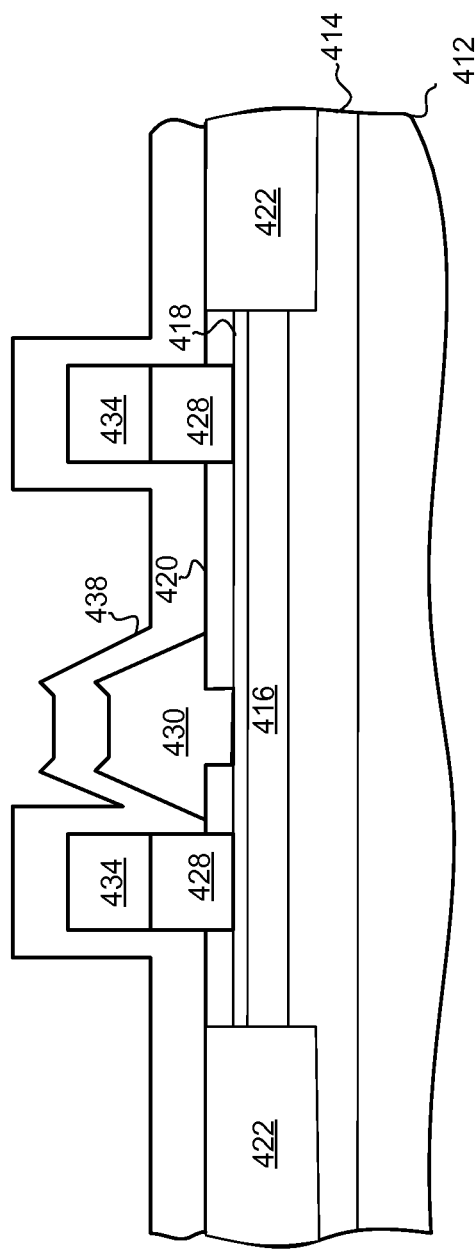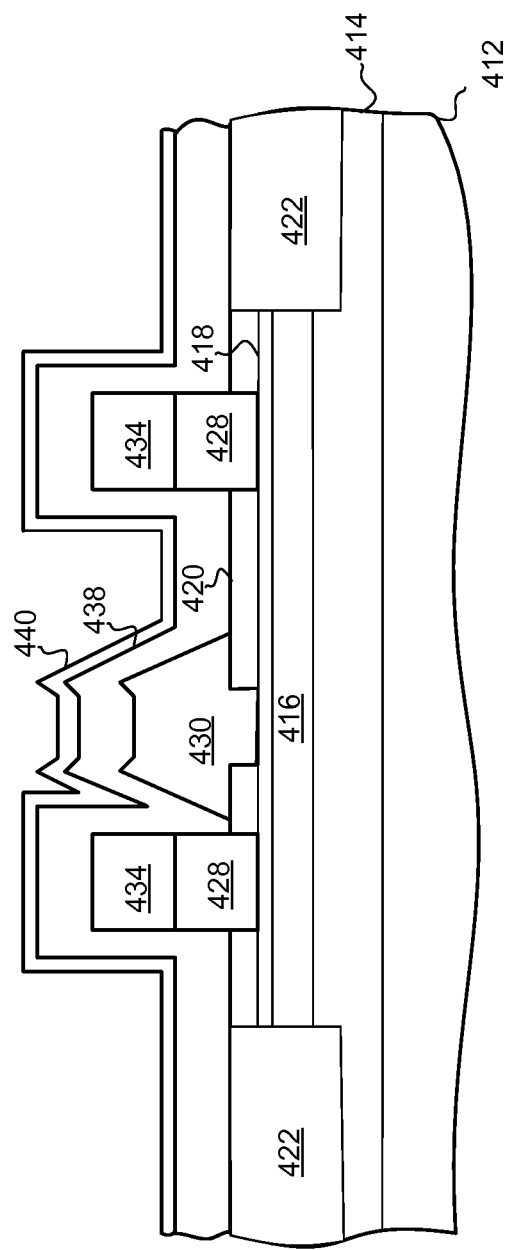

TRANSISTOR WITH CHARGE ENHANCED FIELD PLATE STRUCTURE AND METHOD

BACKGROUND OF THE INVENTION

1. Field of the Invention

The present invention is directed in general to integrated circuit devices and methods for manufacturing same. In one aspect, the present invention relates to the manufacture and use of transistor devices.

2. Description of the Related Art

Semiconductor devices such as transistors are used in a variety of applications. For example, high performance transistor devices are commonly used in high voltage and radio frequency (RF) device technologies. In these applications high performance transistors are used in a variety of switching or signal amplification devices. In the past field plates have been used in such transistors devices to modulate the electric field or capacitance between the gate and drain, between the gate and the source, and/or between the source and the drain. Specifically, the modulation of the electric fields or capacitance provided by the field plate has been used to ensure good high voltage operation and/or good RF linearity.

BRIEF DESCRIPTION OF THE DRAWINGS

The present invention may be understood, and its numerous objects, features and advantages obtained, when the following detailed description is considered in conjunction with the following drawings, in which:

FIG. 2 is a partial cross-sectional side view of a transistor in accordance with an embodiment of the invention;

FIG. 3 is a simplified partial top view of the transistor illustrated in FIG. 2;

FIGS. 5-14 are partial cross-sectional side views of a transistor at various stages in its manufacture according to selected embodiments of the invention;

DETAILED DESCRIPTION

Figure 1:
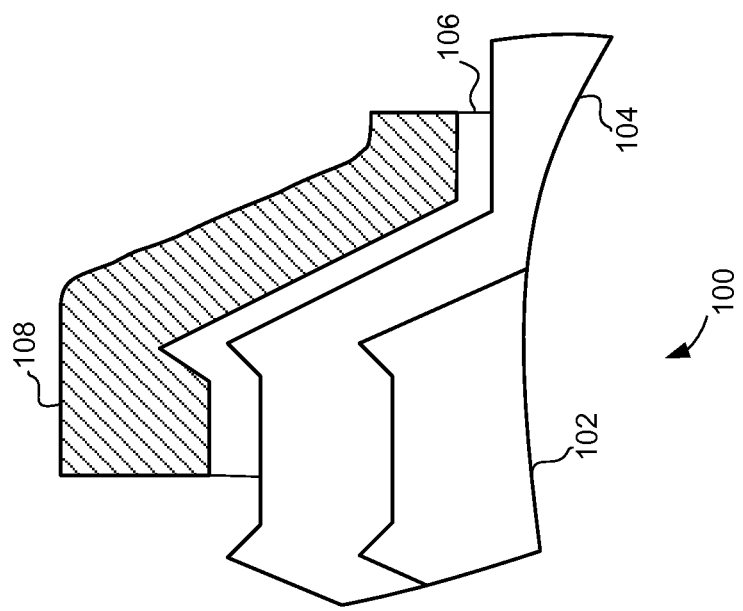
FIG. 1 is a cross-sectional view of a portion of a transistor with a field plate and a charged dielectric layer in accordance with an embodiment of the invention.

The embodiments described herein provide improved high performance transistors and methods of fabricating such transistors. In general, the provided transistors and methods of fabricating the same include a field plate and a charged dielectric layer overlapping at least a portion of the gate. The field plate and charged dielectric layer provide the ability to modulate the electric field or capacitance in the transistor. For example, the charged dielectric layer provides the ability to control the capacitance or the electric field between the gate and field plate. Modulating such capacitances or the electric field in transistors can facilitate improved performance. For example, controlling gate to field plate capacitance can be used to improve device linearity and/or breakdown voltage. Such control over gate to field plate capacitance or electric fields provides for high speed and/or high voltage transistor operation. Thus, the embodiments can be used to improve a wide variety of devices, including power amplifiers, used in radio frequency (RF) applications and switching devices used in a variety of power applications.

Methods of forming such transistors are provided herein. In one embodiment, the method comprises providing a substrate, forming a conductive gate electrode with a contact base portion in contact with a gate contact surface of the substrate, forming drain and source electrodes spaced apart from the conductive gate electrode and in contact with the substrate, and forming a first dielectric layer over the gate, drain, and source electrodes. Then, the method additionally comprises forming a charged dielectric layer over at least a portion of the first dielectric layer, the charged dielectric layer overlapping at least a portion of the gate, and forming a field plate overlapping at least a portion of the charged dielectric layer. So formed, the field plate and charged dielectric layer provide the ability to control capacitances or electric field in the resulting transistor. As described above, controlling such capacitances or electric fields can facilitate improved performance, including improved device linearity and/or improved breakdown voltages. As such, the methods can used to provide high speed and/or high voltage transistor operation.

In other embodiments various transistors are provided. For example, in one embodiment a transistor is provided that comprises a substrate, with a passivation layer, with a gate electrode opening formed therein, a conductive gate electrode located in the gate electrode opening, and a first dielectric layer over the conductive gate electrode. The transistor further includes a charged dielectric layer over at least a portion of the first dielectric layer and overlapping at least a portion of the conductive gate electrode, and a field plate overlapping at least a portion of the charged dielectric layer. Again, such a field plate and charged dielectric layer provide the ability to control capacitances and/or electric fields in the transistor, and can thus provide improved performance, including improved device linearity and/or improved breakdown voltages.

The embodiments described herein can be applied to any transistor that utilizes a field plate. For example, the embodiments can be applied to laterally diffused metal oxide semiconductor (LDMOS) transistors. As another example, the embodiments can be applied to III-V semiconductor transistors such as gallium arsenide (GaAs) transistors and gallium nitride (GaN) transistors. As one specific example, the embodiments can be applied to high frequency, high voltage GaN field effect transistor.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be deposited, grown, etched, masked and/or removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Turning now to FIG. 1, a cross-sectional view of a portion of a transistor portion 100 is illustrated. The illustrated transistor portion 100 includes a portion of a gate electrode 102, a portion of a first dielectric layer 104, a portion of charged dielectric layer 106, and a portion of a field plate electrode 108. The gate electrode 102 would typically be formed in a gate electrode opening in a substrate (not shown in FIG. 1). The first dielectric layer 104 is formed over at least a portion off the gate electrode 102. In accordance with the embodiments described herein, the transistor portion 100 further includes the charged dielectric layer 106 that overlaps over at least a portion of the first dielectric layer 104. Finally, the field plate 108 overlaps at least a portion of the charged dielectric layer 106.

As described above, the addition of the charged dielectric layer 106 and the field plate 108 provides improved ability to control capacitances and/or electric fields in the transistor 100, for example, by providing the ability to control the capacitances or electric field between the gate electrode 102 and the field plate 108. Furthermore, in some embodiments the charged-dielectric layer 106 provides adjustment of capacitances between the field plate and the gate electrode, between the gate electrode and the drain electrode, and adjustment of the electric field adjacent to the gate electrode. Controlling the capacitance or electric field between the gate electrode 102 and the field plate 108 also provides the ability to modulate other capacitances, such as gate-to-source capacitances ($C_{gs}$) and gate-to-drain capacitances ($C_{gd}$). The ability to control these capacitances and the electric field can provide improved device linearity and/or improved breakdown voltages. Thus, the addition of the charged dielectric layer 106 and the field plate 108 can provide improved transistor performance, particularly for high voltage, high speed or high RF linearity operation.

The charged dielectric layer 106 can be formed in a variety of different ways. For example, by depositing a second type of dielectric layer over the first dielectric layer 104 and then injecting charge into the second dielectric layer through the field plate 108. As a second example, the charged dielectric layer 106 can be formed by depositing the second type of dielectric layer over the first dielectric layer 104 and then injecting charge into the second dielectric layer through biasing the field plate 108 to a desired potential versus the gate electrode. Or the charge could be reduced through ultraviolet illumination. Specifically, by transferring charge from the second dielectric layer using ultraviolet light illumination. In these embodiments the field plate 108 can be grounded, floated, or biased at a selected voltage to achieve the desired charge on the charged dielectric layer 106. In these embodiments the field plate 108 could serve as an independent gate electrode of a non-volatile memory transistor. In these kinds of configuration the $1^{st}$ transistor could provide the "typical" amplification function and the $2^{nd}$ transistor provided by the field plate 108 with the charged dielectric could provide the memory effect to control the capacitance or the electric field.

As one specific example, the field plate 108 is additionally coupled to the source electrode and is grounded. In this embodiment the potential of the field plate 108 is fixed and the capacitance would be determined by the thickness of the dielectric underneath. In this case the addition of the charged dielectric layer 106 provides the ability to further tune this capacitance.

As another example, the charged dielectric layer 106 can be formed by depositing the second dielectric layer under deposition conditions that are selected to store charge in the second dielectric layer. For example, by adjusting deposition temperature and/or chemistry in a way that will result in the storage of charge in the second dielectric layer, a charged dielectric layer is formed.

In each of these embodiments the formation of the charged dielectric layer 106 is preferably performed in a way that achieves an amount of charge on the charged dielectric layer 106 to tune capacitances or electric fields to the desired levels. Furthermore, as will be described in greater detail below, in some cases it will be desirable to provide additional terminals and/or circuit devices that can modulate the amount of charge on the charged dielectric layer 106 during operation of the transistor 100.

A variety of different materials can be used to form the charged dielectric layer 106. As one example, the charged dielectric layer 106 can be formed by the conformal deposition of $Al_2O_3$ on the first dielectric layer under appropriate deposition conditions. As another example, the charged dielectric layer 106 can be formed by the conformal deposition of $HfO_2$ on the first dielectric layer. In both these cases the charged dielectric layer 106 can be formed with appropriate fabrication conditions to have an inherently high fixed charged.

In other embodiments the charged dielectric layer 106 can be formed with multiple stacks of different dielectric layers. For example, the charged dielectric layer 106 can comprise an $Al_2O_3/HfO_2$ composite stack or an $Al_2O_3/HfO_2/Al2O_3$ composite stack. In each of these examples the amount of charge of the charged dielectric layer 106 can be controllably determined through the deposition processes used to form the multiple stack layers or through the injection and/or removal of charge using the field plate 108.

Next, it should be noted that while the charged dielectric layer 106 is shown as being coextensive with the field plate 108, that this is just one embodiment and the charged dielectric layer 106 could instead extend beyond the field plate 108. Conversely, the field plate 108 could instead extend beyond the charged dielectric layer 106.

As was mentioned above, in some cases it will be desirable to provide additional terminals and/or circuit devices that can modulate the amount of charge on the charged dielectric layer 106 during operation of the transistor 100. In this case the modulating of the amount of charge in the charged dielectric layer 106 during operation of the transistor 100 can also comprise the adding or removing charge through the field plate 108.

In any case, the controlled modulation of the amount of charge stored on the charged dielectric layer 106 can facilitate fine turning to optimize the capacitance and the electric field and thus the performance of the transistor 100. In a further variation on this embodiment the addition and/or removal of charge using the field plate 108 can facilitate the storage of information on the transistor 100. In this case the charged dielectric layer 106 effectively acts as a memory device for the transistor 100, facilitating improved control over the operation of the transistor 100.

In a further variation on this embodiment the field plate can be formed to comprise a first portion of the field plate and a second portion of the field plate. In this embodiment the first portion of the field plate would be electrically isolated from the second portion of the field plate, and the second portion of the field plate provides the connection used to selectively inject charge into the charged dielectric layer and/or selectively remove charge from the charged dielectric layer. Such charge injection is particularly applicable to embodiments where the charged dielectric layer effectively acts as a memory device for the transistor.

Turning now to FIGS. 2-3, a partial cross-sectional side view and top view of a transistor is illustrated. It should be noted that the top view illustrated in FIG. 3 is simplified to illustrate the relationship between the field plate 202 and the underlying drain and source regions 240 and gate region 242. In this illustrated embodiment the transistor 200 is a GaN transistor, but as noted above this is just one example of the type of transistor that can be implemented with a charged dielectric layer.

Specifically, the transistor 200 comprises a hetero junction field effect transistor (HFET) device with a single field plate 202 overlapping at least in part a charged dielectric layer 204, a first dielectric layer 206, and a gate 208. As depicted, the transistor 200 is formed in a semiconductor substrate 210 which includes a host or base substrate layer 212 formed with an insulating layer, such as sapphire, Si, SiC, diamond, GaN, AlN and various other generally refractory materials. On the host/base substrate layer 212 a gallium nitride (GaN) buffer layer 214, undoped $Al_xGa_{1-x}N$ barrier layer 216, and a thin GaN cap or surface termination layer 218 are sequentially formed using a desired process, such as metal-organic chemical vapor deposition (MOCVD), molecular beam epitaxy (MBE), hydride vapor phase epitaxy (HVPE) or a combination thereof. An active island is formed in the semiconductor substrate 210 to extend from a lower portion of the GaN buffer layer 214. Electrically inactive regions 220 outside the island provide device-to-device isolation and the lower portion provides a transition zone for any crystalline imperfections at the interface with the host/base substrate layer 212. Over the semiconductor substrate, a passivation layer 224 is formed with a dielectric material (e.g., $Si_3N_4$, $SiO_2$, $SiO_xN_y$, AlN, $Al_2O_3$, $HfO_2$, or any combination of the foregoing). Openings are formed in the passivation layer 224 for various electrodes for the transistor 200. In particular, the source/drain electrodes 226-228 make contact through openings in the passivation layer 224 to connect source/drain regions (not shown) in the substrate 210 to the conductive interconnections 230-232 for electrical coupling to various other devices or elements (not shown). In addition, the mushroom or T-gate 208 is formed in a gate opening of the passivation layer 224 with a short gate length contact base at the substrate surface with sidewall extensions formed on or over the underlying dielectric passivation layer 224. The first dielectric layer 206 is formed over the device as a conformal passivation layer in which patterned contact openings are formed (not shown) to expose contacts (e.g., 230, 232). In the contact openings, one or more layers of conductive material are formed to provide the conductive interconnections to other devices or elements (not shown).

As described above, the transistor 200 also includes a field plate 202 and a charged dielectric layer 204. In this illustrated embodiment the field plate 202 and charged dielectric layer 204 are formed over the gate-drain region. However, this is just one example, and the field plate 202 and charged dielectric layer 204 can be formed in additional areas. The charged dielectric layer 204 may be formed with any suitable technique, such as atomic layer deposition (ALD) of a suitable highly charged dielectric material. Likewise, the field plate 202 can be formed with any suitable technique, such as depositing and etching a conductive material over the charged dielectric layer 204. Furthermore, the charge in the charged dielectric layer 204 can be modulated during or after fabrication.

In general, the field plate 202 and the charged dielectric layer 204 creates an electric field that shields the gate 208 from the transistor drain region and electrodes 228, 232 and lowers the peak electric field between gate and drain and associated gate-drain capacitance, thereby providing improved breakdown voltage, RF stability, RF linearity, and/or gain. Furthermore, the addition of the charged dielectric layer 204 provides the ability to more finely tune the capacitance between the gate 208 and the field plate 202, as well as more finely tune the electric field adjacent to the gate 208, thus further improving the breakdown voltage, RF stability, RF linearity, and/or gain.

It should be noted that while the charged dielectric layer 204 is shown remaining only underneath the field plate 202 that this is just one embodiment. For example, in other embodiments the charged dielectric layer 204 is not etched away outside the region of the field plate 202. In this case the charged dielectric layer 204 would remain to cover the transistor first dielectric layer 206 or portions of the transistor first dielectric layer 206.

Finally, it should be noted that the transistor 200 can be considered to be effectively two transistors in series. In this embodiment the gate 208 is the gate of the first transistor, and this first transistor provides an amplification function. The field plate 202 is the gate of the second transistor, and can be used to provide a non-volatile memory capability. Specifically, in this embodiment the existence of the charged dielectric layer 204 makes the field plate 202 effectively closer, such that the field plate 202 can function as the gate of the second transistor.

Figure 4:
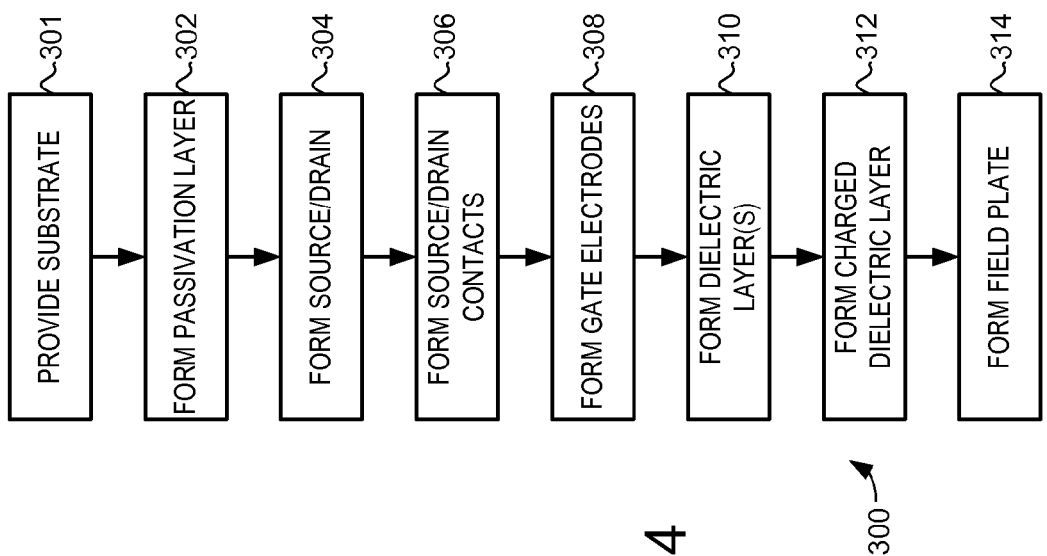
FIG. 4 is a simplified schematic flow chart illustrating a method for fabricating a transistor with a field plate and charged dielectric layer in accordance with selected embodiments of the invention.

As will be appreciated, a variety of different fabrication processes can be used to manufacture the transistor devices described herein. Turning now to FIG. 4, a method 300 for forming a transistor is illustrated. In general, the method 300 comprises providing a substrate, forming a passivation layer over the substrate, forming source and drain contact layer regions, forming source and drain electrodes, forming a conductive gate electrode, forming a dielectric layer over the gate, drain, and source electrodes as an intermediate passivation layer. Then, the method 300 additionally comprises forming a charged dielectric layer (e.g., charged dielectric layer 204) over at least a portion of the first dielectric layer (e.g., dielectric layer 206), the charged dielectric layer overlapping at least a portion of the gate (e.g., gate 208), and forming a field plate overlapping at least a portion of the charged dielectric layer (e.g., field plate 202). So formed, the field plate and charged dielectric layer provide the ability to control capacitances and electric field in the resulting transistor. As described above, controlling such capacitances and electric field can facilitate improved performance, including improved device linearity and/or improved breakdown voltages. As such, the methods can used to provide high frequency and/or high voltage transistor operation. To complete the device more dielectric and metal layers could be formed to achieved the desired circuit functions. Next, it should be noted that while the steps are described and illustrated in a particular order, that many of these steps can be performed in different places in the fabrication process. Thus, the method 300 can be performed in an order different than that illustrated.

The first step 301 is to provide a substrate. In one embodiment the substrate comprises active device layers on SiC, sapphire or Silicon. In one embodiment, the transistor 200 is formed on a substrate that includes an upper gallium nitride cap layer, a middle aluminum gallium nitride barrier layer, and an underlying gallium nitride buffer layer. Of course, this is just one example. As a more detailed example the substrate can include a gallium nitride epitaxial wafer layer that is covered by a passivation surface layer. For example, the passivation surface layer may be formed by depositing a thin layer of SiN, though any desired insulating or dielectric material (e.g., $SiO_2$, $SiO_xN_y$, AlN, $Al_2O_3$) and deposition technique (e.g., conformal CVD, PECVD, PVD, ALD, HWCVD, CAT-CVD, ECR-CVD, ICP-CVD, evaporation, sputtering, etc.) could be used.

The next step 302 is to form a first dielectric layer over the substrate provided in step 301. The next step 304 is to form source/drain regions in the openings in the first dielectric on the substrate. These source/drain contact layers can be formed with any suitable technique, including various types of dopant. The next step 306 is to form source/drain electrode contacts over the source/drain. As one example of how the source/drain regions and contacts can be formed, it can be accomplished using a first patterned etch mask layer that is formed to etch contact openings in the passivation surface layer in which source/drain regions are implanted and contacts formed.

The next step 308 is to form a gate electrode. Again, the gate electrodes can be formed using any suitable process. For example, a gate electrode contact opening can be etched in the surface passivation layer using a suitable patterned resist mask, followed by application of suitable low power reactive ion etch to remove the passivation surface layer from the exposed regions. In the gate electrode opening the gate electrode may be formed by patterning a lift-off resist layer in an area surrounding the etched contact opening. In such a patterned lift-off resist mask layer Schottky gate electrode can be formed that includes lateral extensions or wings which may extend over the underlying passivation surface layer. Of course, this is just one example of the type of process to form a gate electrode. As another example, the gate electrodes could be formed before the source and drain contacts, when appropriate process modules or recipes are practiced.

The next step 310 is to form dielectric layer(s). In one embodiment the dielectric layer(s) provides one or more passivation layers over the gate electrode and/or source/drain contacts. As one specific example, a conformal dielectric layer can be formed with a non-reactive insulating or dielectric material (e.g., SiN) that is deposited (e.g., by sputtering, evaporation, CAT-CVD, HWCVD, ICP, ECR, or ALD) to a predetermined thicknesses (e.g., 400-2000 Å). Furthermore, additional dielectric layers can be formed, including additional layers selected to have predetermined etch selectivity (e.g., $Al_2O_3$) that when deposited can act as an etch stop during subsequent formation of the field plate.

The next step 312 is to form a charged dielectric layer overlapping at least a portion of the dielectric layer(s) and the gate electrode. In one example, the charged dielectric layer is be formed by depositing dielectric material under deposition conditions that are selected to store charge in the charged dielectric layer. For example, by adjusting deposition temperature and/or chemistry in a way that will result in the storage of charge in the dielectric material, thus forming a charged dielectric layer. For example, by depositing the dielectric layer in a non-stoichiometric manner open bonds will be formed between the atoms/ions in the films. So by adjusting, for example, the ratio of the aluminum containing gas to the oxygen containing gas we could change the stoichiometry of an Al2O3 film to an AlxOy film, and thus change the charge density of the resulting dielectric layer.

In other embodiments charge is injected into the charged dielectric layer after the formation of the dielectric material. For example, by applying appropriate voltages to the charged dielectric using the field plate. In this case the applied voltages can be used to both add and remove charge.

In each of these embodiments the formation of the charged dielectric layer is preferably performed in a way that achieves an amount of charge needed to tune capacitance between the field plate and the other elements to the desired levels.

A variety of different materials can be used to form the charged dielectric layer. As some non-limiting examples the charged dielectric layer can be formed by the conformal deposition of $Al_2O_3$, $HfO_2$, $Al_2O_3/HfO_2$ composite stack, or an $Al_2O_3/HfO_2/Al2O_3$ composite stack. In any of these cases the charged dielectric layer can be formed with appropriate fabrications conditions to have an inherently high fixed charged, and/or such charge can be injected in the charged dielectric layer after formation. Furthermore, in some embodiments dopants can be added to the materials to increase the ability to hold charge in the charged dielectric layer. For example, tungsten or similar particles can be added as an interfacial dopant to increase the trap charge density. This can be accomplished by using a thin aluminum rich layer to provide the charge then transition to a more stoichiometric composition during film deposition. In such a process the deposition temperature will affect the effectiveness of incorporation "metallic" particles into the film.

Regardless of the materials used to form the charged dielectric layer, the charged dielectric layer can be formed to have various different levels of charge density. For example, in one embodiment the charged dielectric layer is formed to have a sheet charge density of at least $5E10^{13}$ $cm^{-2}$. This is a considerable increase over the typical levels or charge found in dielectric layers. For example, some typical dielectric layers may have an inherent charge density of $1E10^{10}$ $cm^{-2}$, and a sheet charge density of at least $5E10^{13}$ $cm^{-2}$ is several orders of magnitude larger. In other embodiments the charge density of the charged dielectric layer is between $1E10^{14}$ $cm^{-2}$ and $1E10^{16}$ $cm^{-2}$. Furthermore, it should be noted that such charge density can be achieved during formation of the dielectric layer, or through the additional injection and/or removal of charge after formation. Again, such a charge density is significantly greater than the charge in an ordinary dielectric layer.

The next step 314 is to form a field plate. Again, the field plate can be formed using any suitable technique. For example, the field plate can be formed by the formation and patterning of one or more conductive layers.

As will be appreciated, additional fabrication steps may be performed to fabricate and complete the transistor structures described herein. For example, other circuit features may be formed on the wafer structure. For example, other terminals and circuits for modulating the charge on the charged dielectric layer can be formed. Furthermore, other devices, such as transistor devices, isolation region formation, gate dielectric and electrode formation. In addition, backend processing steps (not depicted) may be performed, typically including formation of one or more levels of interconnect vias and conductors in one or more additional passivation layers so as to connect the transistors in a desired manner to achieve the desired functionality. Thus, the specific sequence of steps used to complete the fabrication of the semiconductor structures may vary, depending on the process and/or design requirements.

Thus, method 300 provides a process for manufacturing improved high performance transistors. Specifically, the method 300 provides a transistor with a field plate and a charged dielectric layer overlapping at least a portion of the transistor gate. The field plate and charged dielectric layer provide the ability to control capacitances and electric fields in the transistor. Modulating such capacitances and electric fields facilitates improved performance such as device linearity and/or breakdown voltage. Thus, method 300 can be used to improve a wide variety of transistor based devices, including high frequency or high speed switching devices used in radio frequency (RF) applications.

Turning now FIGS. 5-14, a detailed example of a fabrication process will now be illustrated. Specifically, FIGS. 5-14 are simplified cross-sectional views at different stages of manufacture which result in a heterojunction field effect transistor device according to one embodiment.

An initial manufacturing stage shown in the simplified partial cross-sectional view in FIG. 5 depicts a wafer structure having a substrate with an epitaxial gallium nitride layer(s) and a passivation surface layer. In an example embodiment, the wafer structure includes a host or base substrate layer 412. Depending on the type of transistor device being fabricated, the substrate layer 412 may be implemented as a bulk semiconductor substrate, an insulator substrate, a bulk metal substrate, a single crystalline silicon (doped or undoped) substrate, a poly-silicon substrate or other polycrystalline semiconductor substrate such as polycrystalline SiC, a semiconductor-on-insulator (SOI) substrate, a single or multi-layered composite film wafer substrate or any material including, for example, Si, SiC, SiGe, SiGeC, Ge, GaAs, InAs, InP, sapphire, diamond, GaN, or AlN, as well as other Group III-IV compound semiconductors or any combination thereof. For high voltage, high frequency applications, the substrate should have at least moderate thermal conductivity ($\kappa > 2$ W/cm-K) and have high electrical resistivity ($\rho > 10^4$ ohm-cm) or semi-insulating ($\rho > 10^6$ ohm-cm) or even insulating ($\rho > 10^{12}$ ohm-cm) properties. At the same time, its cost should be appropriate for the application. For these reasons, SiC ($\kappa = 4$ W/cm-K, $\rho = 10^6$-$10^{11}$ ohm-cm) is a preferred choice for high frequency RF applications, while Si ($\kappa = 2$ W/cm-K, $\rho = 10^{-1}$-$10^4$ ohm-cm) is an acceptable choice for lower frequency, cost-sensitive power switch or RF applications, although for certain specific applications other substrates as discussed above may be used.

The wafer structure also includes an epitaxial substrate layer 414 formed (e.g., grown or deposited) on or over the substrate to a predetermined thickness. The epitaxial substrate layer 414 may be implemented with gallium nitride (GaN) and/or aluminum nitride (AlN), or any alloys such as aluminum gallium nitride (AlGaN), indium gallium nitride (InGaN), aluminum indium gallium nitride (AlInGaN), or silicon carbide (SiC). These materials are semiconductor compounds with strong chemical bonds that produce a wide, direct bandgap that provides high breakdown field strength. Group III nitrides and their associated heterostructures (such as AlGaN/GaN, InAlN/GaN, InGaN/GaN, etc.) have a number of attractive properties including high electron mobility, high breakdown field strength, high electron sheet density, and others. Accordingly, group-III nitride materials are being widely investigated in many microelectronic applications such as transistors and optoelectronic devices. In selected embodiments, the epitaxial substrate layer 414 may be formed with an epitaxial growth process that is seeded from a seed or nucleation layer (not shown) on the substrate so that a single crystal epitaxial substrate layer 414 is formed. In selected embodiments, the epitaxial substrate layer 414 is formed on surface of substrate by, for example, Metal-Organo Chemical Vapor Deposition (MOCVD), Molecular Beam Epitaxy (MBE), or Hydride Vapor Phase Epitaxy (HVPE) with MOCVD being preferred for GaN. As described herein and understood by those skilled in the art, the process of forming an epitaxial layer may be described as either depositing or growing a layer so that the "growth" and "deposition" terms are used interchangeably in this respect. As formed, the predetermined thickness of the epitaxial substrate layer 414 may be in the range of approximately 0.05 to 20 micrometers, preferably about 0.3 to 2 micrometers, but thicker and thinner layers may also be used.

The wafer structure may also include an additional undoped or doped $Al_XGa_{1-X}N$ barrier layer 416 formed on the epitaxial substrate layer 414 using any desired technique (e.g., MOCVD, MBE, HVPE, or the like) to a predetermined thickness (e.g., approximately 50-400 Å, preferably about 50-250 Å) to form a hetero-junction. In addition, the wafer structure surface may be covered or terminated with GaN cap or surface termination layer 418 formed on the barrier layer 416 using any desired technique (e.g., MOCVD, MBE, HVPE, or the like) to a predetermined thickness (e.g., approximately 5-80 Å).

On the wafer structure, a first passivation layer 420 is formed with any desired insulating or dielectric material, such as $Si_3N_4$ (silicon nitride), $SiO_2$, $SiO_xN_y$, AlN, $Al_2O_3$, and/or other suitable combinations or mixtures thereof. The first passivation layer 420 may be formed by depositing $Si_3N_4$ on the surface of the GaN cap or surface termination layer 418 by low-pressure chemical vapor deposition (LPCVD), plasma enhanced chemical vapor deposition (PECVD), physical vapor deposition (PVD), atomic layer deposition (ALD), evaporation, sputtering or other well-known techniques. In selected embodiments, the first passivation layer 54 is formed using LPCVD $Si_3N_4$ to a predetermined thicknesses (e.g., in the range of approximately 50 to 4000 Å, and more particularly about 500-1500 Å), though other thicknesses and materials can be used. As will be appreciated, the choice of material for first passivation layer 420 will depend upon the choice of material for underlying substrate layers and may be selected to render the surface of the underlying substrate stable and having appropriate electrical properties (e.g., charged or neutral without significant surface states) during subsequent processing steps. In selected embodiments, the formation of the passivation layer 420 will reduce leakage current in the finally formed device by properly preparing the surface of the GaN surface termination layer 418 for deposition, and then depositing a silicon nitride film having a low hydrogen content (e.g., <10%) to prevent a leakage current path from forming at the passivation film and underlying substrate.

FIG. 6 illustrates processing of the semiconductor structure subsequent FIG. 5 and after isolation regions 422 are formed in the substrate prior to ohmic contact formation. Though any suitable technique may be used for forming the isolation regions 422, an example approach would be to deposit and pattern an implant mask (not shown) as a layer of photoresist to define and expose the intended isolation regions 422 while covering and protecting the substrate and passivation layer 420 in the active region area or "island." Alternatively, the implant mask may be formed by depositing and selectively etching one or more mask layers (e.g., silicon nitride or silicon dioxide) over the first passivation layer 420. Alternatively, the active channel layers and a portion of 414 may be etched away after the passivation layer 420 to form a "mesa" (not shown), after which a second LPCVD SiN layer or other suitable dielectric (such as silicon dioxide, $Al_2O_3$, etc.) would be formed to cover the etched regions. However formed, the isolation regions 422 effectively define a mesa or island section for the active regions in the substrate. In selected embodiments, the isolation regions may be formed by implanting any desired species of material into the exposed (unmasked) regions of the substrate to generate defects (e.g., vacancies) and/or an amorphous crystal structure therein, including but not limited to implanting disruptive species (e.g., nitrogen ions, argon ions, helium ions, oxygen ions, or other inert implant species) at a predetermined implant energy and dopant concentration (e.g., at least approximately $10^{11}$ atoms/$cm^2$) so as to form isolation regions 422 in an upper portion of the exposed (unmasked) regions of the substrate where the implanted ions are incorporated into the structure of the isolation regions 422. As formed, the isolation regions 422 electrically isolate the active region island to limit leakage current flow from outside the active region to conducting structures on the device mesa(s) or island(s) (e.g., gate and drain electrodes, contact pads of the source, drain and gate electrodes, and active regions of adjacent device(s) formed on the same substrate). As will be appreciated, the isolation regions 422 generally have an electrical isolation property with a sheet resistance of in the range of about $10^9$ ohms/□ for implanted isolation regions and in the range of $10^6$ ohms/□ for mesa isolated regions; mesa isolated regions' resistivity is limited by the resistivity of the GaN buffer that remains after mesa etching. When an implant process is used, the isolation regions 422 have a high vacancy concentration (e.g., greater than about $10^{18}$ to $10^{20}$ vacancies/$cm^3$) or crystalline defects which limit, or prevent, the transport of free carriers (e.g., electrons or holes) which contribute to the conductivity of the material. When a mesa isolation process is used, the removal of the active device channel leaves only the high resistivity buffer to conduct free carriers in the vicinity of the device. In the embodiments depicted hereafter, implant isolation is preferred, although in some situations, one may choose mesa etching or even a combination of mesa and implant isolation because of device requirements, the type of epitaxial wafer structure used, leakage requirements, equipment availability, cost, and other factors known to one with ordinary skill in the art.

Figure 7:
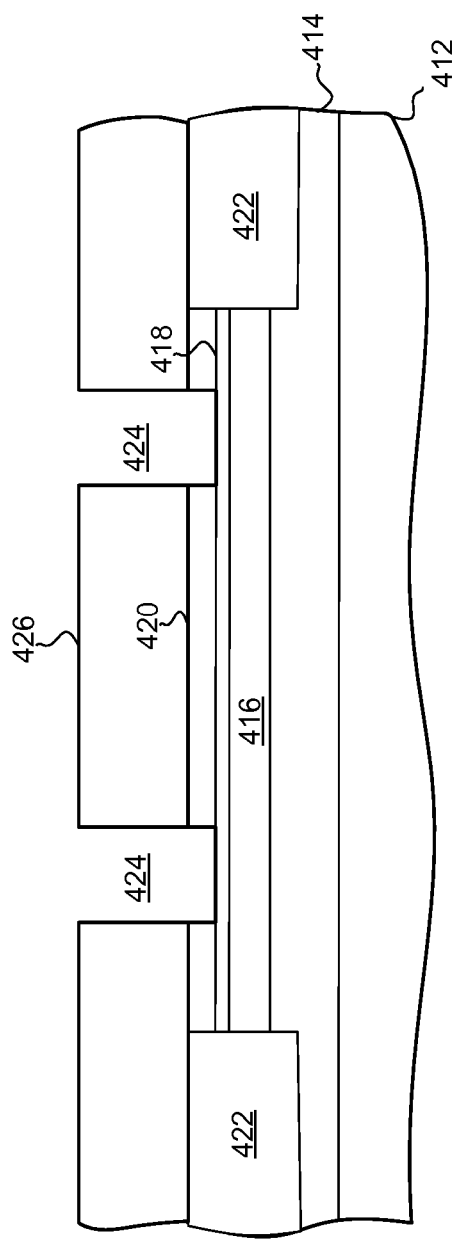

FIG. 7 illustrates processing of the semiconductor structure subsequent to FIG. 6 after source and drain contact openings 424 are formed with a selective etch mask 426 to remove portions of the passivation surface layer 420 and thereby expose the substrate. As a preliminary step, the isolation implant mask (not shown) is removed or stripped with an appropriate etch chemistry to leave the remnant passivation layer 420. Subsequently, a patterned etch mask 426 is formed, such as by depositing and patterning a layer of photoresist to define and expose openings 424 over the intended source/drain regions while otherwise protecting the substrate and passivation layer 420 in the active region area. Depending on the number of type of layers formed in the passivation layer 420, one or more contact etch processes may be applied (such as reactive-ion etching, ion beam etching, plasma etching, laser etching, or the like) to form the source/drain contact openings 424 through the passivation surface layer 420 to expose the substrate surface at the intended source and drain regions. In selected embodiments, the source and drain contact openings 424 are formed by using a patterned photoresist or etch mask layer as a mask to etch a silicon nitride passivation surface layer 420 with a suitable selective etch chemistry.

Figure 8:
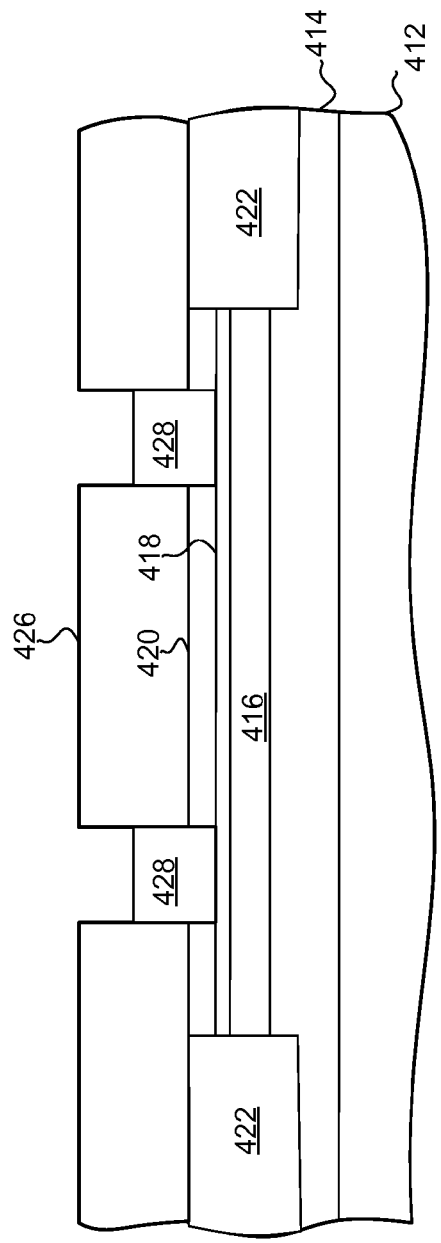
Figure 9:
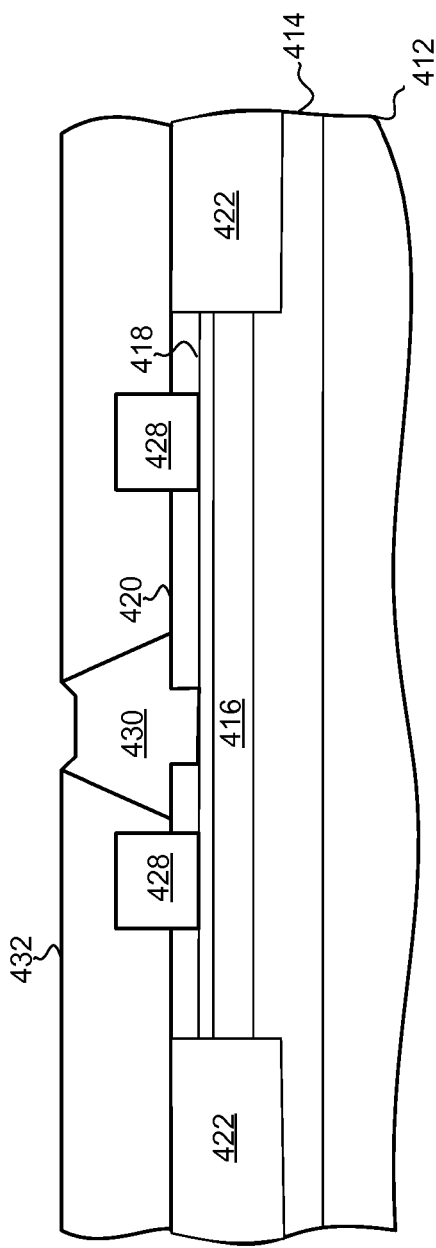

FIG. 8 illustrates processing of the semiconductor structure subsequent to FIG. 7 after one or more source/drain electrodes 428 are formed in contact openings 424. At this stage, the source and drain 428 may be formed with any desired contact formation sequence, including but not limited to using a lift-off process which uses the same patterned photoresist or etch mask layer used to form source and drain contact openings 424. Alternatively, any desired metal deposition and masking and etching sequence may also be used to form the source and drain 428 with one or more ohmic metal contact layers. When GaN is used for the surface termination layer 418, the source and drain contacts 428 may be formed as layered TiAlMoAu or TiAlNiAu layers formed by evaporation with the Ti layer in contact with the GaN surface termination layer 418, though other metal combinations and formation procedures can be used. Once formed, the contacts 428 may be annealed (e.g., at 850 C for 30 sec) as one or more alloy layers to provide ohmic contact to the channel using any desired anneal process, such as a furnace or rapid thermal anneal (RTA), where the anneal can be performed at this step or at any other step in the process preceding the formation of the isolation implant regions. If desired, the implant isolation regions may instead be formed after the ohmic anneal step. As will be appreciated, the formation of contacts depicted in FIGS. 7-8 is provided for illustration purposes, and the contacts may instead be formed at a different stage of fabrication, such as prior to the formation of the isolation regions 422.

After forming the source/drain contacts 428, a mushroom or T-shaped gate electrode 430 is formed to contact the substrate using any suitable sequence of fabrication steps. For example, a preliminary etch is applied to selectively etch an opening in the surface passivation layer 420 by stripping the etch mask 426, forming a patterned gate etch or photoresist mask (not shown) to define and expose the surface passivation layer 420 over the intended gate electrode contact region, and then applying one or more gate contact etch processes (such as reactive-ion etching, ion beam etching, plasma etching, laser etching, or the like) to form the gate contact opening through the passivation surface layer 420. Once the gate contact surface is exposed, the patterned gate etch/photoresist mask is removed, and the gate contact surface may be annealed at 300-600 C to remove anneal damage from the surface. Also at this stage, one or more gate insulator layers (e.g., silicon dioxide, $Al_2O_3$, $HfO_2$) may be deposited over the gate contact surface and over surface passivation layer 420 to form MISFET or MOSFET devices. Following annealing and possible gate dielectric deposition, a lift-off resist mask 432 may be formed in which a gate electrode opening is formed to expose the gate contact surface of the substrate with an opening larger than the gate contact opening etched in the surface passivation layer 420, and then filled with a gate metal to form the gate electrode 430. To illustrate this sequence, reference is now made to FIG. 9 which illustrates processing of the semiconductor structure subsequent to FIG. 8 after a gate electrode opening is developed in a lift-off resist mask 432 to expose portions of the substrate structure at the intended gate electrode contact area. The lift-off resist mask 432 may be formed by patterning an optical or e-beam resist layer to define an opening for gate metal.

After forming the gate electrode opening in the lift-off resist mask 432, one or more gate metal layers are deposited to form the gate electrode 430 in the gate electrode opening. At this stage, the patterned gate electrode 430 may be formed after depositing one or more gate insulator layer or conductor layers (e.g., oxide, $Al_2O_3$, $HfO_2$ and/or metal layers) on the substrate structure and at the bottom of the gate electrode opening to form either HEMT, MESFET, MISFET or MOSFET devices. In selected embodiments, one or more initial gate Schottky contact layers (e.g., a Ni—Au or Pt—Au multi-layer) are formed or deposited in the gate electrode opening to provide a suitable gate contact for an underlying epi GaN substrate layer 418 by depositing approximately 200 to 1000 Angstroms of Ni, Pd, Ir, Re, Cu, or Pt in the gate electrode opening to provide the desired gate contact. In selected embodiments, Ni is preferred. This Schottky metal is surmounted by 100-20,000 Angstroms of Au to provide lower resistance, but other metals (e.g., Al, Cu, etc.), semi-metals, semiconductors and combinations thereof can also be used to form the gate contact. In some configurations, Pt, Pd, Ir, Re, or other suitable barrier metal may be used as a diffusion barrier layer between the Ni, Pd, Ir, Re, Cu, or Pt Schottky metal and Au to prevent Au from mixing with the Schottky metal. As will be appreciated, the gate electrode 430 may be formed with any desired gate formation sequence, including but not limited to metal deposition and etching processes or a lift-off process wherein a gate metal (e.g., a metal comprising Ni and Au) is deposited on the mask 432 and in the gate electrode openings so that, when the mask 432 is removed (e.g., by standard resist strip solvent), only the gate electrode 430, remaining passivation layer 420, and contacts 428 remain.

Figure 10:
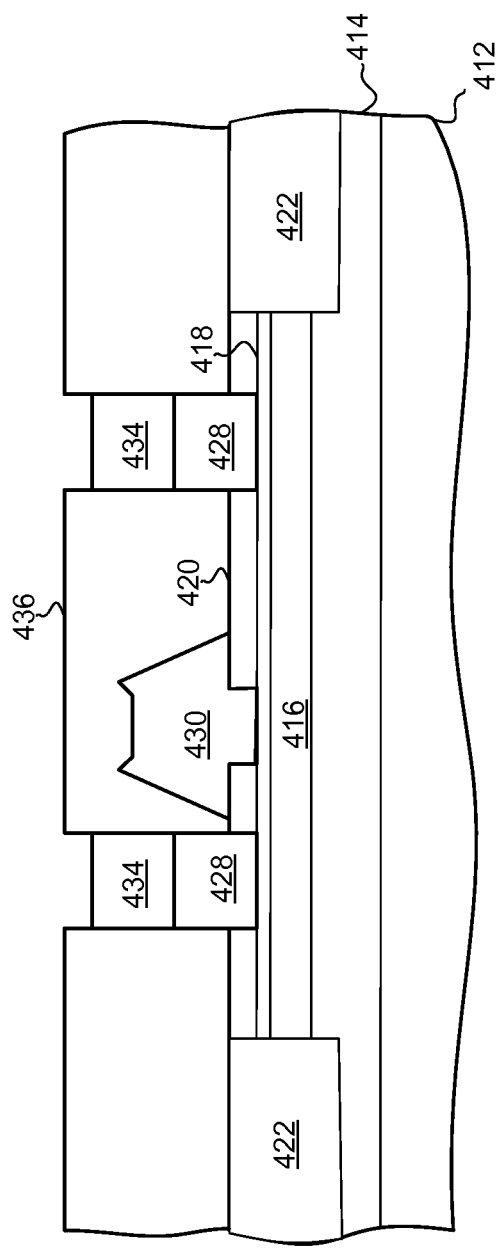

If desired, additional electrodes (such as source/drain electrodes or capacitor plates) can be formed separately. This is illustrated in FIG. 10 which depicts processing of the semiconductor structure subsequent to FIG. 9 after one or more first metal layers 434 are formed in openings of a patterned mask layer 436. As a preliminary step, the lift-off resist mask 432 is removed or stripped with an appropriate etch chemistry to leave the remnant passivation layer 420, gate electrode 430, and contacts 428. Subsequently, a patterned mask layer 436 may be formed by depositing and patterning a layer of photoresist with patterned openings which expose the source/drain contacts 428 while covering and protecting the gate electrode 430 and remnant passivation layer 420 in the active region area. The patterned openings in the mask 436 may also expose a capacitor plate area (not shown) over an isolation region. At this stage, the first metal layer(s) 434 may be formed by depositing one or more "metal 1" layers on the patterned mask layer 436 to fill the patterned openings therein. In selected embodiments, the first metal layer(s) 434 may be formed with any desired metal formation sequence, including but not limited metal deposition and etching processes or a lift-off process wherein a metal is deposited on the mask 436 and its patterned openings so that, when the mask 436 is removed (e.g., by standard resist strip chemicals), only the gate electrode 430, passivation layer 420, contacts 428, and first metal layer(s) 434 remain. With the first metal layers, the "metal 1" layers may be used to form both the source/drain electrodes 65 and a bottom MIM capacitor plate (not shown).

FIG. 11 illustrates processing of the semiconductor structure subsequent to FIG. 10 after one or more first dielectric layers 438 are formed to cover the exposed sidewall surfaces of the gate electrode 430, the source/drain contacts 428, passivation layer 420 and the metal layers 434. In an example implementation, the first dielectric layers 438 may be formed with any desired insulating or dielectric material (e.g., $Si_3N_4$, $SiO_2$, $SiO_xN_y$, AlN, $Al_2O_3$, and/or other suitable combinations or mixtures thereof) using any desired deposition technique (e.g., conformal CVD, PECVD, PVD, ALD, hot wire-CVD (HWCVD), catalytic CVD (CAT-CVD), electron-cyclotron resonance CVD (ECR-CVD), inductively coupled plasma CVD (ICP-CVD), evaporation, sputtering, etc.) to a predetermined thickness (e.g., approximately 400-20,000 Angstroms) to cover the semiconductor structure. In selected embodiments, an initial dielectric layer 438 is formed as an inter-layer dielectric (ILD) with a material having low hydrogen (e.g., <10%) and low ionic or electronic charge content. In these embodiments, the first dielectric layers are created by sputtering SiN and $SiO_2$ or a combination of these films over all exposed surfaces of the gate electrode 430, source/drain contacts 428, passivation layer 420 and metal layers 434. Other embodiments may use SiN deposition by ICP, ECR, PECVD or other techniques that provide low hydrogen films and that have adequate coverage of the sidewalls of gate 430. In other embodiments, the first dielectric layer(s) 438 are formed with a highly conformal ALD layer of SiN or $Al_2O_3$ where all exposed surfaces of the gate electrode 430, source/drain contacts 428, passivation layer 420 and metal layers 43 are coated to a uniform thickness. Of course, it will be appreciated that the first dielectric layer(s) 438 may be formed prior to formation of the first metal layer(s) 434, provided that the source/drain contacts 428 are appropriately protected or cleared of any dielectric layer(s) 438 prior to forming the first metal layer(s) 434. In this case, a second or additional passivation layer could be deposited after forming the first metal layer(s) 434, and then patterned and etched to during formation of the additional second metal layers.

FIG. 12 illustrates processing of a semiconductor structure subsequent to FIG. 11 after an intermediate etch stop layer (not shown in FIG.) and a second dielectric layer 440 are sequentially disposed over the first dielectric layers 438. As will be discussed in greater detail below, the second dielectric layer 440 is formed to provide the charged dielectric layer. In selected embodiments, the intermediate etch stop layer is formed by depositing an insulator or high-k dielectric (e.g., a metal-oxide) having different etch selectivity from the second dielectric layer 440 using chemical vapor deposition (CVD), plasma-enhanced chemical vapor deposition (PECVD), physical vapor deposition (PVD), atomic layer deposition (ALD), sputtering, evaporation, or any combination(s) of the above. In one example implementation, the intermediate etch stop layer is a metal-oxide compound formed by chemical vapor deposition, physical vapor deposition, or by atomic layer deposition having a typical final thickness is in the range of 5-100 nanometers, though other thicknesses may be used. A suitable metal oxide compound for use as the intermediate etch stop layer is an aluminum-based dielectric (e.g., $Al_2O_3$ or AlN) or a hafnium-based dielectric (e.g., $HfO_2$), though other oxides, silicates or aluminates of zirconium, aluminum, lanthanum, strontium, tantalum, titanium and combinations thereof may also be used, including but not limited to $Ta_2O_5$, $ZrO_2$, $TiO_2$, $Y_2O_3$, $La_2O_3$, $HfSiO_X$, $ZrSiO_X$, $ZrHfOx$, $LaSiO_X$, $YSiO_X$, $ScSiO_X$, $CeSiO_X$, $HfLaSiO_X$, $HfAlO_X$, $ZrAlO_X$, and $LaAlO_X$. In addition, multi-metallic oxides (for example barium strontium titanate, BST) may also provide high-k dielectric properties with suitable etch selectivity, depending on the etch process used.

On the intermediate etch stop layer the second dielectric layer 440 is formed to a predetermined thickness (e.g., approximately 100-20,000 Angstroms) with a dielectric material capable of storing charge. In selected embodiments, the second dielectric layer 440 can comprise any suitable combination of $Al_2O_3$, $HfO_2$, $Al_2O_3/HfO_2$ composite stack, or an $Al_2O_3/HfO_2/Al2O_3$ composite stack. In such an embodiment the second dielectric layer 440 can be formed by atomic layer deposition (ALD) of $Al_2O_3$ or $HfO_2$ to a predetermined thickness.

Figure 13:
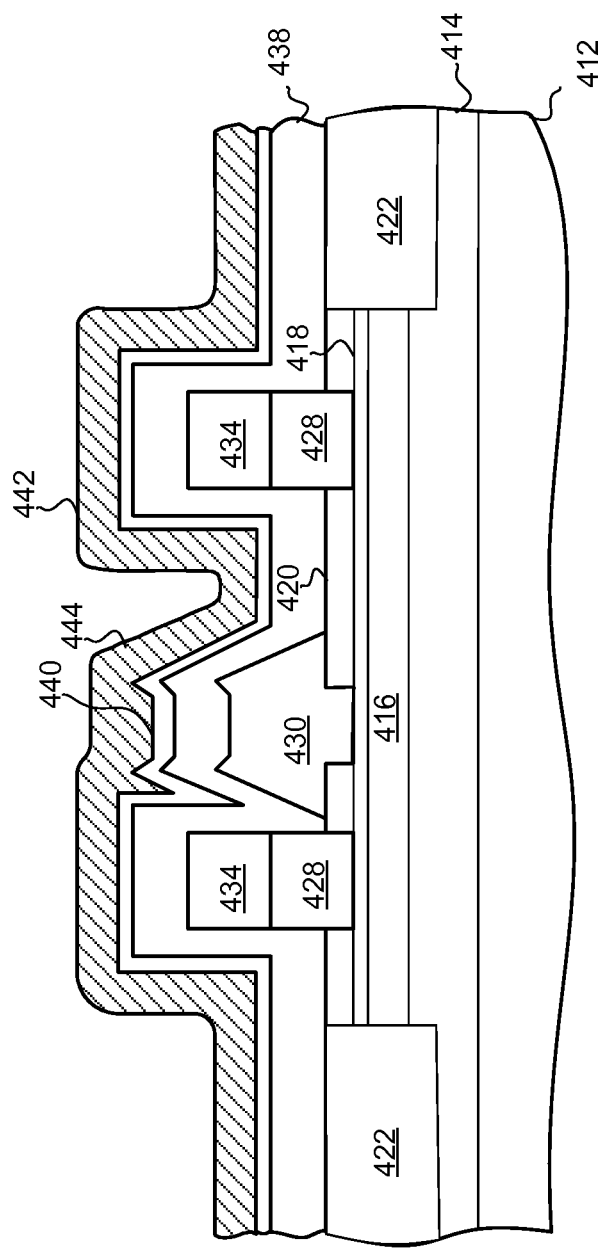

Next, one or more continuous layers 442 of conductive metal material are formed to cover at least a portion of the second dielectric layer 440 and overlapping at least a portion of the gate electrode 430. This is illustrated in FIG. 13 which depicts processing of the semiconductor structure subsequent to FIG. 12 after one or more metal layers 442 are formed. In selected embodiments, the metal layers 442 may be formed with any desired metal formation sequence, either by sputtering followed by patterned dry etch or by evaporation and lift-off method.

Figure 14:
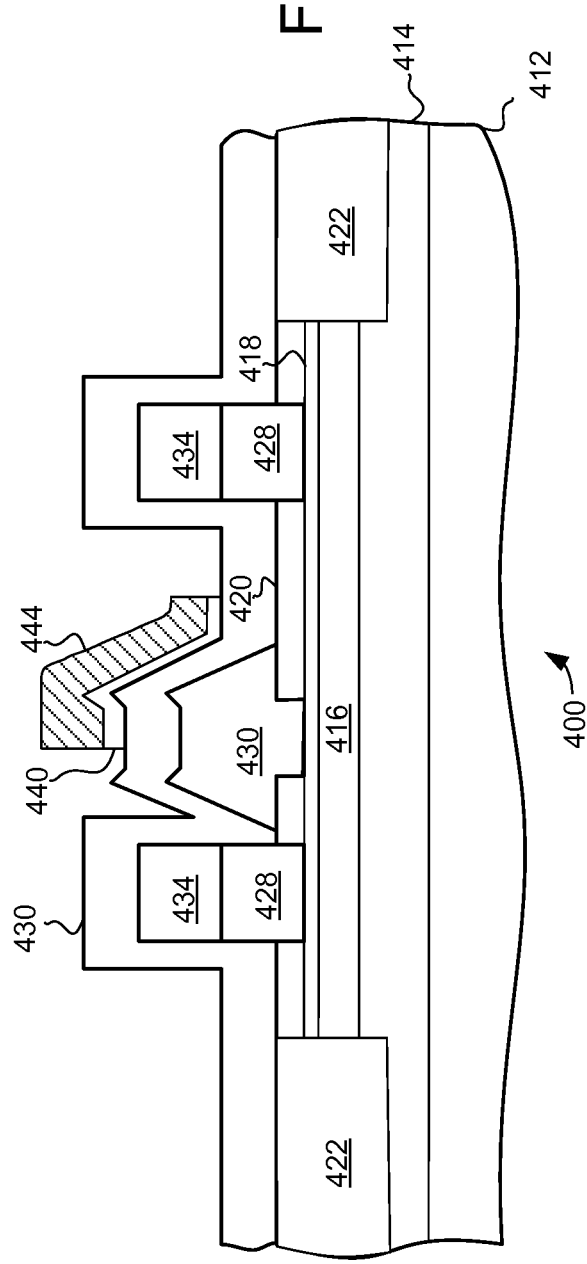

Next, the one or more continuous layers 442 of conductive metal material are patterned to define the field plate 444. This is illustrated in FIG. 14 which depicts processing of the semiconductor structure subsequent to FIG. 13 after the one or more metal layers 442 are patterned to define the field plate 444. This patterning of the layers 442 can be performed using any suitable technique, including etching. In alternate examples a lift-off process is used. In a lift off process metal is deposited on a patterned mask so that, when the patterned mask is removed (e.g., by standard resist strip chemicals), only the field plate 444 remains. Or conventional sputtered deposition followed by dry etching could be used to define the field plates.

As will be appreciated, the field plate 444 may be electrically connected to other portions of the semiconductor structure, such as the gate electrodes or the source drain electrodes using one or more conductive layers. For example, to connect the semiconductor structure to other circuitry, additional interconnect layers may be formed to complete the gate, source, and drain electrodes using any desired metallization, masking and etching steps. As will be appreciated, additional conductive or metal layers may be formed in direct ohmic contact with the source/drain metal layers to define separate source and drain conductor paths, such as by using any desired metal formation sequence, including but not limited to contact and via formation in interlayer dielectric layers using damascene processes, lift-off processes, plasma etching, etc.

Again, it should be noted that the transistor 400 can be considered to be effectively two transistors in series. In this embodiment the gate 430 is the gate of the first transistor, with this gate being used primary to provide amplification. The field plate 444 can function as the gate of the second transistor. Specifically, in this embodiment the existence of the charged dielectric layer 440 makes the field plate 444 effectively closer, such that the field plate 444 can function as the gate of the second transistor. In this embodiment, the second gate can be used to provide a non-volatile memory capability. Thus, the gate 430 provides amplification function and the field plate 444 provides a memory function using the charged dielectric layer. Specifically, the second transistor can act as a multi-state memory just like a non-volatile MNOS device where the charges stored in the charged dielectric layer serves to define the memory state. As one example, a simple case will be a higher charge for one state and a lower charge for another state and etc.

As was described above, in a further variation on the embodiments described above the field plate can be formed to comprise a first portion of the field plate and a second portion of the field plate. In this embodiment the first portion of the field plate would be electrically isolated from the second portion of the field plate, and the second portion of the field plate provides the connection used to selectively inject charge into the charged dielectric layer and/or selectively remove charge from the charged dielectric layer. Such a charge injection is particularly applicable to embodiments where the charged dielectric layer effectively acts as a memory device for the transistor.

Figure 15:
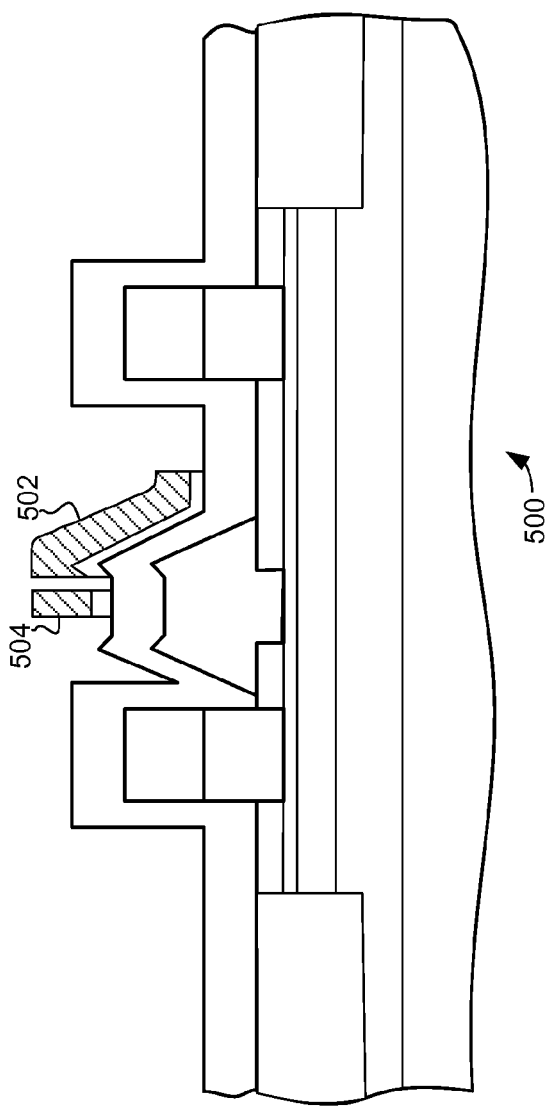
FIG. 15 is a partial cross-sectional side view of a second transistor in accordance with an embodiment of the invention.
Figure 16:
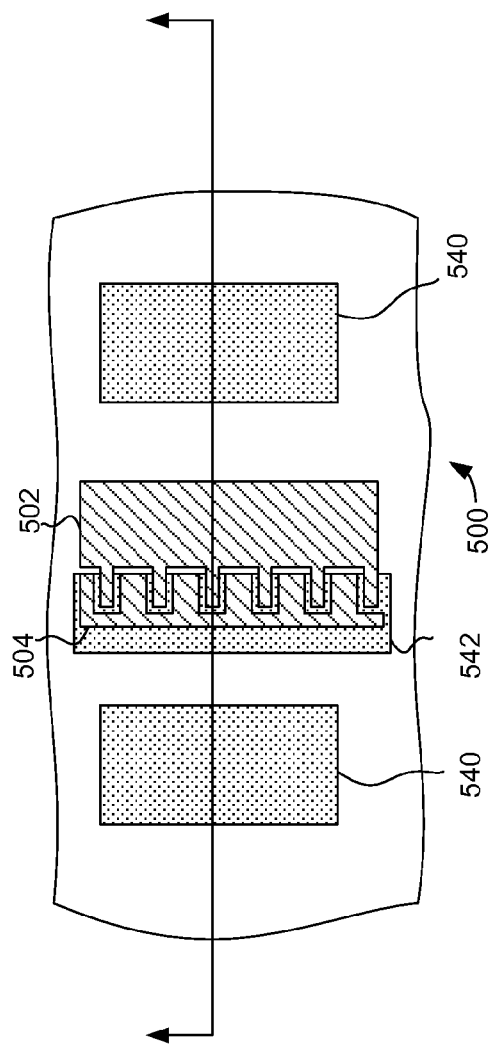
FIG. 16 is a simplified partial top view of the transistor illustrated in FIG. 15; and It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

Turning now to FIGS. 15 and 16, a partial cross-sectional side view and top view of a transistor 500 is illustrated. Again, it should be noted that the top view illustrated in FIG. 16 is simplified to illustrate the relationship between the first and second portions of the field plate and the underlying source/regions 540 and gate region 542. This transistor 500 illustrated in FIGS. 15 and 16 includes a first portion of the field plate 502 and a second portion of the field plate 504. In this embodiment the first portion of the field plate 502 would be ohmically isolated from the second portion of the field plate 504, and the second portion of the field plate 504 provides the connection used to selectively inject charge into the charged dielectric layer and/or selectively remove charge from the charged dielectric layer. Such a charge injection is particularly applicable to embodiments where the charged dielectric layer effectively acts as a memory device for the transistor. In this embodiment the interlocking pattern of the first portion of the field plate 502 and the second portion of the field plate 504 can be defined using a lithographic patterning processes. It should be noted that while the illustrated example shows the patterning as also patterning the underlying charged dielectric layer, that this is just one embodiment. In other cases the underlying charged dielectric layer is contiguous under both portions of the field plate.

Specifically, the ability to selectively inject charge into the charged dielectric layer provides the ability to "modulate" the capacitance and the electric field between gate and drain. When a desired characteristics of RF performance is achieved, the amount of the injected charged could be fixed. This procedure can be particularly useful during device development and performance optimization.

In an additional variation on this embodiment at least one portion of the field gate can overlap a "non-charged" dielectric layer. For example, the first portion of the field plate 502 could overlap a "non-charged" dielectric layer while the second portion of the field plate overlaps a charged portion of the dielectric layer. Such an embodiment can be formed by forming the first portion of the field plate 502 before the deposition of the charged dielectric layer, then forming the charged dielectric layer, followed by the forming the second portion of the field plate 504. Such an embodiment may be used to further modulate the dependence of gate-to-drain capacitance versus drain voltage in a FET for fine adjustment of RF linearity of the transistor. Furthermore, this embodiment can provide an enhancement over putting both the gate electrodes and field plates on one single type of dielectric layer.

Although the described embodiments disclosed herein are directed to high performance transistors and methods for making same, the present invention is not necessarily limited to the example embodiments which illustrate inventive aspects of the present invention that are applicable to a wide variety of transistor fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the various devices illustrated herein are described with reference to switch devices formed on GaN-based materials and Si or SiC substrates, this is merely for convenience of explanation and not intended to be limiting and persons of skill in the art will understand that the principles taught herein apply to devices formed with different substrate materials. Accordingly, the identification of particular regions being formed with one type of material or another is merely by way of illustration and not limitation and other materials may be substituted in order to form devices. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

The embodiments described herein thus provide a method of forming a transistor, comprising: providing a substrate; forming a conductive gate electrode with a contact base portion in contact with a gate contact surface of the substrate; forming drain and source electrodes spaced apart from the conductive gate electrode and in contact with the substrate; forming a first dielectric layer over the gate, drain, and source electrodes; forming a charged dielectric layer over at least a portion of the first dielectric layer, the charged dielectric layer overlapping at least a portion of the gate; and forming a field plate overlapping at least a portion of the charged dielectric layer.

Other embodiments provide a method of forming a gallium nitride transistor, comprising: providing a substrate with a gallium nitride layer covered by a surface passivation layer; forming a conductive gate electrode with a contact base portion in contact with a gate contact surface of the substrate; forming drain and source electrodes spaced apart from the conductive gate electrode and in contact with the substrate; forming a first dielectric layer over the gate, drain, and source electrodes; depositing a second dielectric layer over at least a portion of the first dielectric layer, the second dielectric layer overlapping at least a portion of the gate; forming a field plate overlapping at least a portion of the second dielectric layer; and selectively adding or removing an amount of charge in the second dielectric layer through the field plate until the second dielectric layer has sheet charge density of at least $5E1013$ cm$^{-2}$.

Other embodiments provide a transistor device, comprising: a substrate; a passivation surface layer covering the substrate with a gate electrode opening formed therein; a conductive gate electrode located in the gate electrode opening to be in contact with the substrate; a first dielectric layer over the conductive gate electrode; a charged dielectric layer over at least a portion of the first dielectric layer and overlapping at least a portion of the conductive gate electrode; and a field plate overlapping at least a portion of the charged dielectric layer.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A transistor device, comprising:
   a substrate;
   a passivation surface layer covering the substrate with a gate electrode opening formed therein;
   a conductive gate electrode located in the gate electrode opening to be in contact with the substrate;
   a first dielectric layer over the conductive gate electrode;
   a charged dielectric layer over at least a portion of the first dielectric layer and overlapping at least a portion of the conductive gate electrode, the charged dielectric layer including open bonds to provide a fixed charge density in the charged dielectric layer;
   a field plate overlapping at least a portion of the charged dielectric layer; and
   a circuit, the circuit coupled to the field plate, the circuit configured to drive the field plate to cause the field plate to inject charge into the charged dielectric layer until the charged dielectric layer has sheet charge density of at least $5E10^{13}$ cm$^{-2}$.

2. The transistor device of claim 1, wherein the transistor device comprises a gallium nitride transistor.

3. The transistor device of claim 1, wherein the charged dielectric layer is formed under deposition conditions in a non-stoichiometric manner configured to form the open bonds to provide the fixed charge density in the charged dielectric layer.

4. The transistor device of claim 1, wherein the charged dielectric layer extends beyond the field plate.

5. The transistor device of claim 1, wherein the charged dielectric layer comprises a conformal layer of $Al_2O_3$ on the first dielectric layer, and wherein the fixed charge density in the charged dielectric layer comprises a sheet charge density of at least $5E10^{13}$ cm$^{-2}$ in the conformal layer of $Al_2O_3$.

6. The transistor device of claim 1, wherein the charged dielectric layer comprises a layer selected from a group consisting of $Al_2O_3$, $HfO_2$, an $Al_2O_3/HfO_2$ composite stack, and an $Al_2O_3/HfO_2/Al2O_3$ composite stack.

7. The transistor device of claim 1, wherein the circuit is further configured to modulate the sheet charge density during operation of the transistor.

8. The transistor device of claim 6, wherein the circuit is configured to modulate the sheet charge density during operation of the transistor by selectively adding or removing charge in the charged dielectric layer through the field plate.

9. The transistor device of claim 1, wherein the field plate comprises a first portion of the field plate and a second portion of the field plate, the first portion of the field plate electrically isolated from the second portion of the field plate, and wherein the second portion of the field plate provides a connection to selectively inject charge into the charged dielectric layer and selectively remove charge from the charged dielectric layer.

10. The transistor device of claim 1, wherein the field plate effectively functions as a second gate electrode, and wherein the conductive gate electrode provides amplification function and the field plate provides a memory function using the charged dielectric layer.

11. The transistor device of claim 1, wherein the circuit is further configured to selectively modulate the charge in the charged dielectric layer to cause an adjustment of capacitances between the field plate and the gate electrode and between the gate electrode and the drain electrode, and further to cause an adjustment of an electric field adjacent to the gate electrode.

12. The transistor device of claim 1, wherein the fixed charge density in the charged dielectric layer is between about $1E10^{14}$ cm$^{-2}$ and $1E10^{16}$ cm$^{-2}$.

13. A transistor device, comprising:
a substrate;
a passivation surface layer covering the substrate with a gate electrode opening formed therein;
a conductive gate electrode located in the gate electrode opening to be in contact with the substrate;
a first dielectric layer over the conductive gate electrode;
a charged dielectric layer over at least a portion of the first dielectric layer and overlapping at least a portion of the conductive gate electrode, the charged dielectric layer formed to include open bonds to provide a fixed sheet charge density of at least $5E10^{13}$ cm$^{-2}$; and
a field plate overlapping at least a portion of the charged dielectric layer.

14. The transistor device of claim 13, wherein the transistor device comprises a gallium nitride transistor.

15. The transistor device of claim 13, wherein the charged dielectric layer is formed under deposition conditions configured to form the open bonds in a non-stoichiometric manner to provide the fixed sheet charge density of at least $5E10^{13}$ cm$^{-2}$ in the charged dielectric layer.

16. The transistor device of claim 13, wherein the charged dielectric layer extends beyond the field plate.

17. The transistor device of claim 13, wherein the charged dielectric layer comprises a conformal layer of $Al_2O_3$ on the first dielectric layer.

18. The transistor device of claim 13, wherein the charged dielectric layer comprises a layer selected from a group consisting of $Al_2O_3$, $HfO_2$, an $Al_2O_3/HfO_2$ composite stack, and an $Al_2O_3/HfO_2/Al2O_3$ composite stack.

19. The transistor device of claim 13, further comprising a circuit for modulating an amount of charge in the charged dielectric layer during operation of the transistor.

20. The transistor device of claim 13, wherein the field plate comprises a first portion of the field plate and a second portion of the field plate, the first portion of the field plate electrically isolated from the second portion of the field plate, and wherein the second portion of the field plate provides a connection to selectively inject charge into the charged dielectric layer and selectively remove charge from the charged dielectric layer.

21. The transistor device of claim 13, further comprising:
a circuit, the circuit coupled to the field plate, the circuit configured to drive the field plate to cause the field plate to inject charge into the charged dielectric layer to selectively modulate the charge in the charged dielectric layer to cause an adjustment of capacitances between the field plate and the gate electrode and between the gate electrode and the drain electrode.

22. A transistor device, comprising:
a substrate;
a passivation surface layer covering the substrate with a gate electrode opening formed therein;
a conductive gate electrode located in the gate electrode opening to be in contact with the substrate;
a first dielectric layer over the conductive gate electrode;
a charged dielectric layer over at least a portion of the first dielectric layer and overlapping at least a portion of the conductive gate electrode, the charged dielectric layer formed in a non-stoichiometric manner to include open bonds to provide a fixed charge density in the charged dielectric layer;
a field plate overlapping at least a portion of the charged dielectric layer; and
a circuit, the circuit coupled to the field plate, the circuit configured to drive the field plate to cause the field plate to inject charge into the charged dielectric layer until the charged dielectric layer has a fixed sheet charge density of at least $5E10^{13}$ cm$^{-2}$, and wherein the circuit is further configured to selectively modulate the charge in the charged dielectric layer to cause an adjustment of capacitances between the field plate and the gate electrode and between the gate electrode and the drain electrode.

23. The transistor device of claim 22, wherein the charged dielectric layer extends beyond the field plate.

24. The transistor device of claim 22, wherein the charged dielectric layer comprises a layer selected from a group consisting of $Al_2O_3$, $HfO_2$, an $Al_2O_3/HfO_2$ composite stack, and an $Al_2O_3/HfO_2/Al2O_3$ composite stack.

* * * * *